United States Patent
DiTommaso

(10) Patent No.: US 7,292,100 B1
(45) Date of Patent: Nov. 6, 2007

(54) INTERPOLATED VARIABLE GAIN AMPLIFIER WITH MULTIPLE ACTIVE FEEDBACK CELLS

(75) Inventor: Vincenzo DiTommaso, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 136 days.

(21) Appl. No.: 11/089,043

(22) Filed: Mar. 22, 2005

(51) Int. Cl.
*H03F 3/45* (2006.01)
(52) U.S. Cl. .................. 330/254; 330/282; 330/284; 330/85
(58) Field of Classification Search ................ 330/254, 330/282, 284, 85
See application file for complete search history.

(56) References Cited

U.S. PATENT DOCUMENTS

| | | | | |
|---|---|---|---|---|
| 5,077,541 A | * | 12/1991 | Gilbert | 330/284 |
| 5,684,431 A | * | 11/1997 | Gilbert et al. | 330/254 |
| 6,445,248 B1 | * | 9/2002 | Gilbert | 330/51 |
| 6,621,346 B1 | * | 9/2003 | Nabicht et al. | 330/284 |
| 7,088,179 B2 | * | 8/2006 | Gilbert et al. | 330/254 |
| 2005/0077958 A1 | * | 4/2005 | Bunner | 330/86 |

OTHER PUBLICATIONS

E. Brunner and B. Gilbert, Analog Devices, Inc.; *The Active Feedback Amplifier—A Versatile Analog Building Block*, Oct. 1994, pp. 131-136.
E. Brunner and B. Gilbert, Analog Devices, Inc.; *The Active Feedback Amplifier—A Versatile Analog Building Block*, Oct. 1994, pp. 131-136.

* cited by examiner

*Primary Examiner*—Patricia Nguyen
(74) *Attorney, Agent, or Firm*—Marger Johnson & McCollom, PC

(57) ABSTRACT

An interpolated variable gain amplifier (VGA) utilizes multiple active feedback cells. The active feedback cells may be implemented as transconductance (gm) cells that replicate gm cells in the interpolated input stages.

21 Claims, 4 Drawing Sheets

INTERPOLATED VARIABLE GAIN AMPLIFIER WITH MULTIPLE ACTIVE FEEDBACK CELLS

BACKGROUND

FIG. 1 illustrates a prior art variable gain amplifier (VGA) having an interpolated attenuator. The VGA of FIG. 1 includes an attenuator network 14 that receives an input signal $V_{IN}$ and provides a series of progressively attenuated versions of the input signal at tap points along the attenuator. A series of input stages 16 selectively couple the attenuated signals to a main amplifier 18 in response to a series of control signals $I_1 \ldots I_N$ from an interpolator 12. The input stages are typically implemented as transconductance (gm) cells having there noninverting (+) inputs connected to corresponding tap points on the attenuator. The maximum gain of the amplifier is set by a network of passive components $R_A$ and $R_B$ which provide a common feedback signal to the inverting (−) inputs of the gm cells.

If the control signals are implemented as simple on/off signals, the amplifier would behave as a switched-gain amplifier in which the gain changes in discrete steps as different input stages are selected along the length of the interpolator. However, to provide continuously variable gain, the interpolator 12 generates the control signals $I_1 \ldots I_N$ so that adjacent signals are fully or partially "on" to varying degrees, thereby providing a continuum of gain settings between the discrete settings available at the individual taps. That is, the control signals from the interpolator are a series of continuous, overlapping current pulses (in a spatial sense) having a centroid whose location moves along the length of the interpolator as a gain control signal $V_{CTRL}$ is varied so that most of the control signals are nearly zero, but adjacent input stages near the centroid are enabled to some extent. Thus, the VGA of FIG. 1 is referred to as a continuously interpolated VGA.

FIG. 2 illustrates another prior art VGA having continuous interpolation of input stages along an attenuator. The VGA of FIG. 2 is similar to that of FIG. 1 with the following key differences. Rather than having single-ended attenuator, the VGA of FIG. 2 has a fully differential attenuator 22 in which the tap points produce differential pairs of attenuated signals. The feedback signal is no longer applied to the input stages 24. Instead, an active feedback stage including feedback resistors $R_4$ and $R_5$ and active feedback cell 30 are arranged as in an active feedback amplifier (AFA). This frees up the inverting (−) inputs of the input stages, thereby allowing them to operate in a fully differential mode and take full advantage of the differential outputs from the attenuator. In this configuration, the maximum gain is determined by the ratio of the maximum gain of the input section to the gain of the active feedback stage.

Since the input section is no longer directly in a feedback loop, the VGA of FIG. 2 relies on matching and ratios of components in the input section and active feedback stage to provide non-linearity cancellation and other forms of compensation, e.g., temperature, frequency, etc. For example, if the input stages 24 are implemented as gm cells, then the feedback cell 30 is typically implemented as a gm cell that matches the gm cells in the input stages.

DETAILED DESCRIPTION

Figure 1:
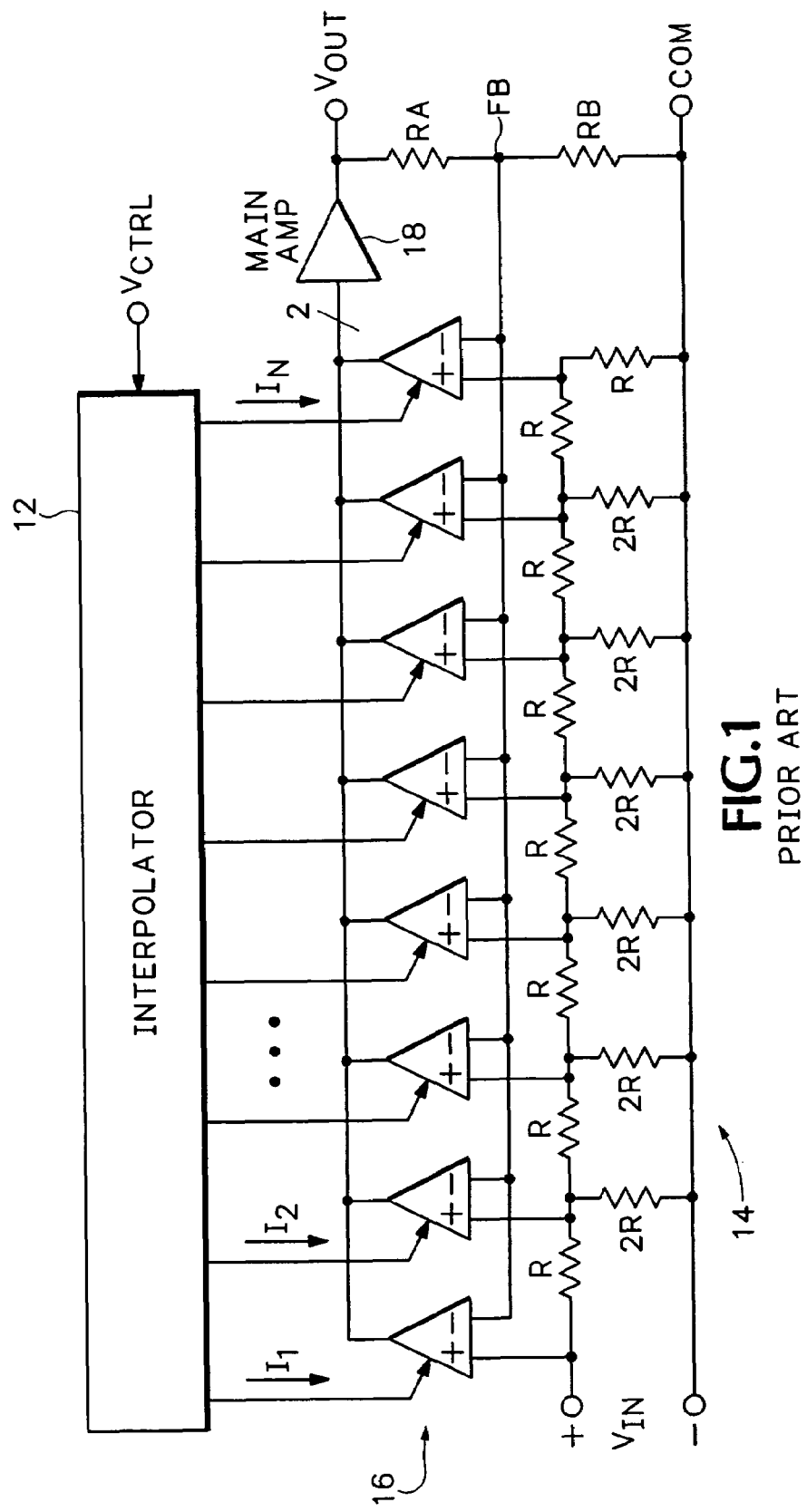
FIG. 1 illustrates a prior art interpolated VGA.
Figure 2:
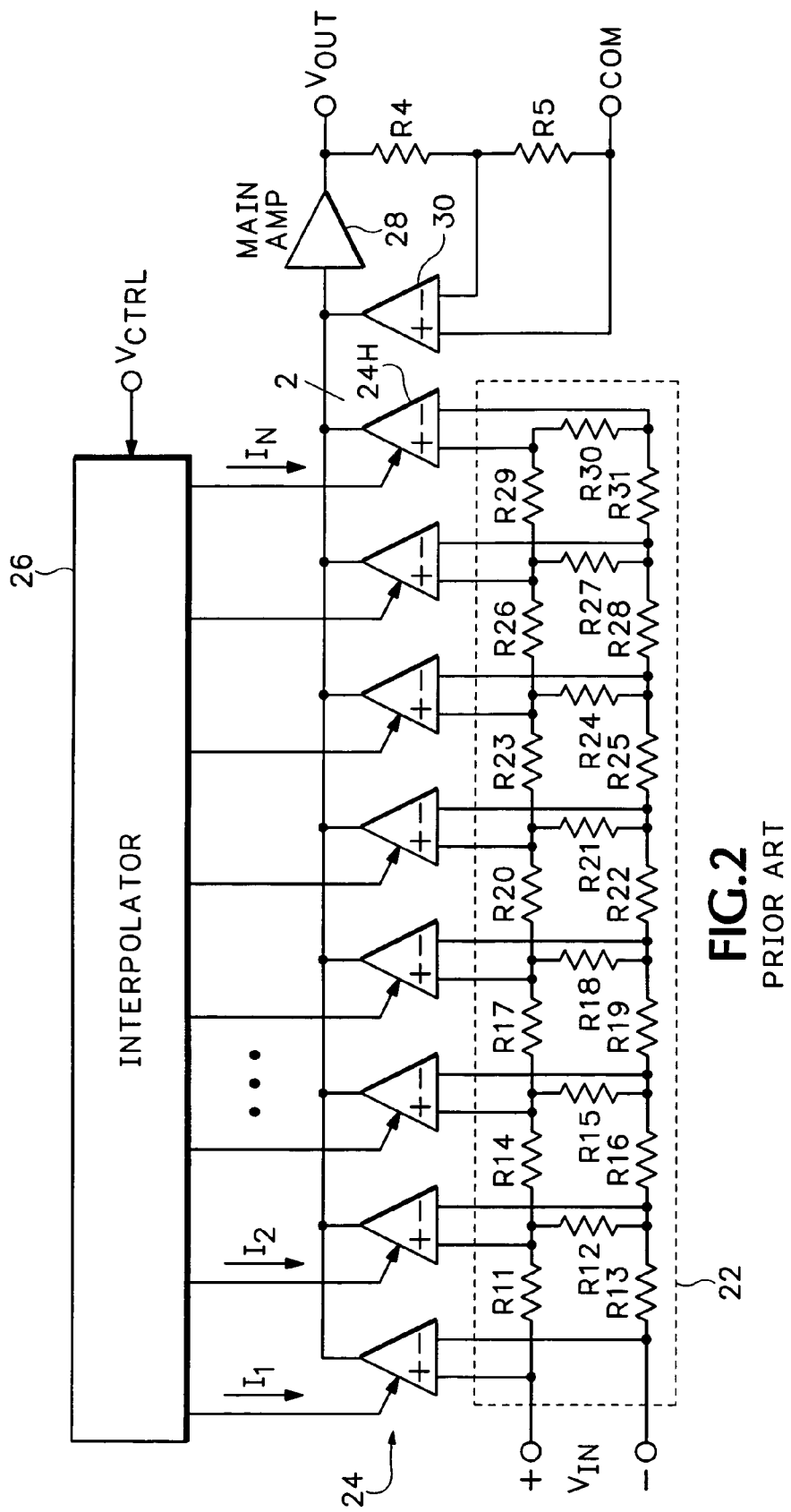
FIG. 2 illustrates another prior art interpolated VGA.
Figure 3:
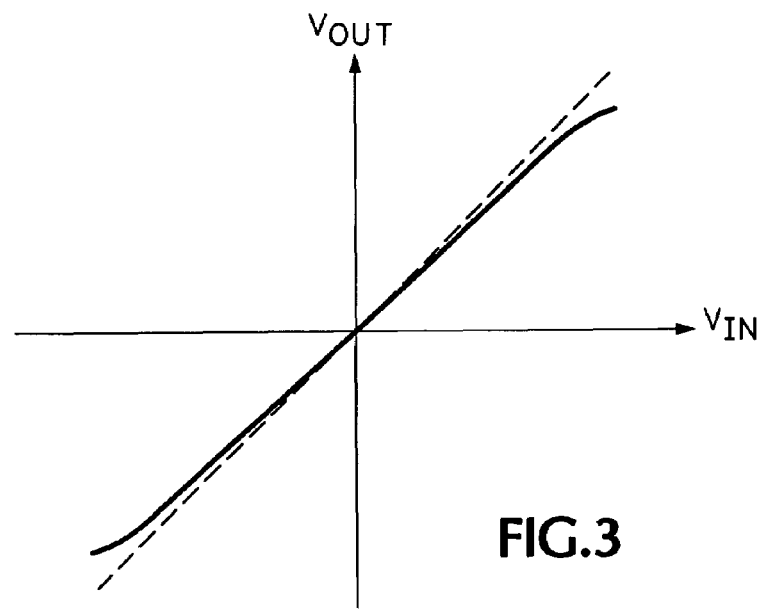
FIG. 3 illustrates output characteristics of the VGA of FIG. 2.

Although the VGA of FIG. 2 may provide adequate performance in some applications, it still suffers from inaccuracies that may be understood with reference to FIG. 3 which illustrates, in a generalized manner, ideal and actual output characteristics of the VGA of FIG. 2. In the ideal situation, the output $V_{OUT}$ would always vary linearly in response to variations in the input signal $V_{IN}$. However, mismatches in device geometry, temperature characteristics, gm cell bias currents (tail currents), etc., typically cause the actual output characteristic to diverge from the ideal curve, especially towards the extremities of the operating range as shown in FIG. 3.

To further illuminate the nature of the accuracy problem, it may be helpful to examine the following equation which characterizes the operation of the VGA of FIG. 2:

$$I_1 \tanh(V_{IN}/2V_T) + \ldots + I_N \tanh(V_{IN}/N2V_T) = I_T \tanh(V_{IN}'/2V_T) \quad \text{(Eq. 1)}$$

where the input stages are implemented as gm cells having tail currents $I_1, I_2, \ldots I_N$ which are provided by the interpolator 26, and the feedback cell is implemented as a gm cell having a fixed tail current $I_T$. The active feedback stage causes the main amplifier 28 to force the input $V_{IN}'$ to the active feedback cell to whatever value forces the sum of the hyperbolic tangent (tanh) terms on the left side of Eq. 1 to equal the tanh term on the right. In essence, the system of FIG. 2 attempts to collectively replicate the input stages using a single active feedback cell.

From Eq. 1, it becomes apparent that the accuracy of the system may be fundamentally limited because the active feedback gm cell may only by able to accurately cancel the nonlinearities, temperature dependencies, and other sources of error in a single gm cell in the input section. But in operation, inaccuracies are being introduced simultaneously by multiple gm cells, each of which may be operating at different tail currents. It may be possible to determine some "optimal" value of the tail current through the active feedback gm cell that minimizes overall system distortion under some specific set of operating conditions, or that keeps distortion below some arbitrarily determined value over a certain range of operating conditions. However, even this "optimal" value may provide inadequate performance as the various operating conditions are varied relative to one another, or it may simply not be adequate for other, more demanding, applications.

Figure 4:
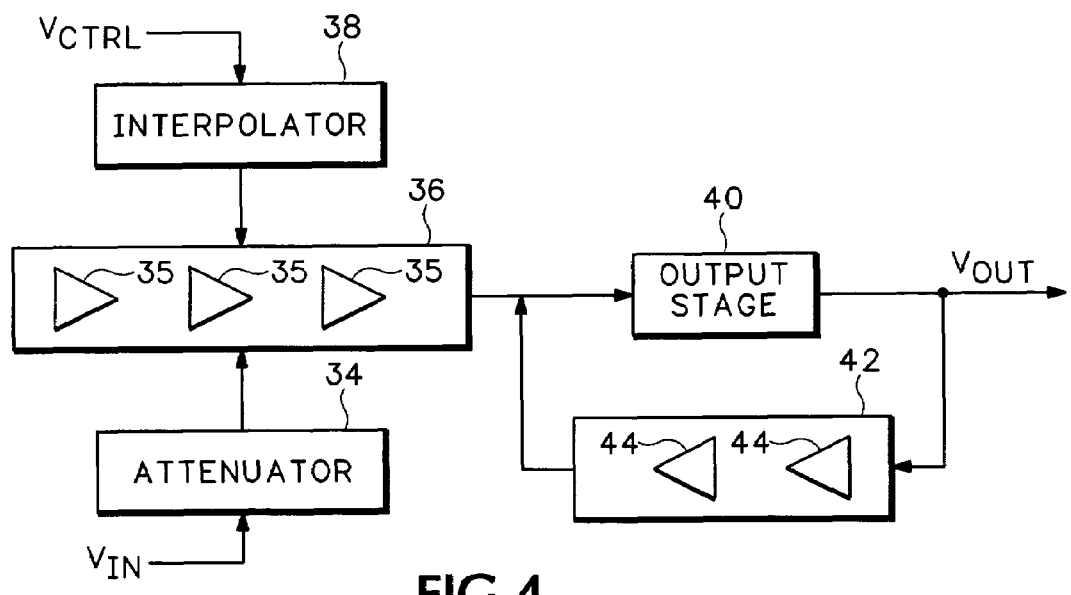
FIG. 4 illustrates an embodiment of an interpolated VGA according to the inventive principles of this patent disclosure.

FIG. 4 illustrates an embodiment of a VGA according to the inventive principles of this patent disclosure. The embodiment of FIG. 4 includes an attenuator 34, an input section 36, an interpolator 38, an output stage 40 and an active feedback stage 42 having multiple active feedback cells 44. Having more than one active feedback cell may enable the embodiment of FIG. 4 to individually replicate (or approximate) the input stages 35 in the input section. This may provide performance benefits, especially, as the number of input stages designed into interpolated VGAs trends upward in an effort to achieve ever lower gain ripple.

The use of ever increasing numbers of input stages may cause the signal path to spread out over more stages, thus making it more difficult to cancel nonlinearities and compensate for other effects using only a single active feedback cell. Using multiple active feedback cells according to the inventive principles of this patent disclosure may provide more flexibility in canceling nonlinearities, compensating for temperature, frequency and other effects, replicating individual input stages, replicating multiple of input stages, shaping the response of the overall system, etc.

Figure 5:
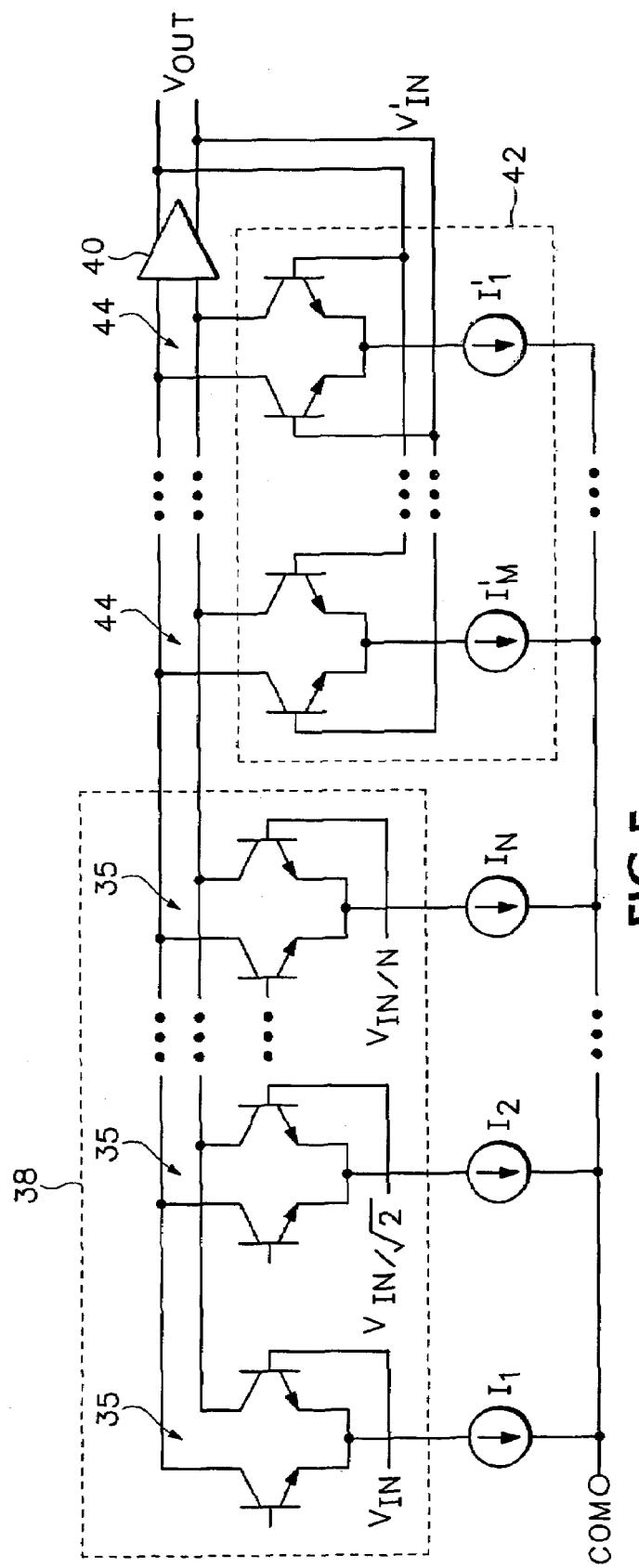
FIG. 5 illustrates another embodiment of an interpolated VGA according to the inventive principles of this patent disclosure.

FIG. 5 illustrates another embodiment of a VGA according to the inventive principles of this patent disclosure. The attenuator and interpolator are omitted for simplicity. In the embodiment of FIG. 5, the input stages 35 are implemented as gm cells biased by tail currents $I_1 \ldots I_N$, while the active feedback cells 44 are implemented as parallel gm cells biased by tail currents $I_1' \ldots I_M'$, where N is the number of input stages, and M is the number of active feedback cells. Although all of the input stages could be replicated in the active feedback stage (that is, N=M), this may be unnecessary in most implementations. For example, in a VGA having 25 interpolated input stages, five to seven active feedback cells have been found to provide adequate cancellation and compensation for a high-performance radio frequency (RF) VGA.

In the embodiment of FIG. 5, the output from the output stage 40 is connected directly back to the first feedback cell as a first feedback signal $V_{IN}'$, while attenuated versions of this signal are generated through a feedback attenuator and applied to the other feedback cells. In operation, $V_{IN}'$ is forced to the same value as $V_{IN}$, while the inputs to other feedback cells may be forced to match the inputs to other input stages, e.g., $V_{IN'/N}=V_{IN/N}$. The values of the tail currents $I_1' \ldots I_M'$ are fixed at the nominal values some of the tail currents, e.g., $I_1 \ldots I_N$ in the input section.

An active feedback arrangement according to the inventive principles of this patent disclosure provides tremendous flexibility that may allow a designer to achieve virtually any level of compensation depending on how many replication components are used and how they are implemented. For example, in the embodiment of FIG. 5, the use of a feedback attenuator that matches all or part of the input attenuator may provide additional nonlinearity cancellation. Likewise, the tail currents $I_1' \ldots I_M'$ may be implemented with another interpolator or other bias current generator so they vary in the same manner as the interpolator currents $I_1 \ldots I_N$ in the input section, thus causing the active feedback cells to more closely replicate the operation of the input stages.

The inventive principles of this patent disclosure have been described above in the context of some preferred embodiments for purposes of illustration. The inventive principles, however, are not limited to these particular embodiments, and other effective arrangements can be devised in accordance with the inventive principles of this patent disclosure. For example, some transistors have been illustrated as bipolar junction transistors (BJTs), but CMOS and other types of devices may be used as well. Likewise, some signals and mathematical values have been illustrated as voltages or currents, but the inventive principles of this patent disclosure are not limited to these particular signal modes. As a further example, the use of multiple active feedback cells has been described in the context of an "IVGA", meaning a VGA whose function addresses the wide range of signal amplitudes present at the input of the element. The inventive principles, however, may also be applied to an "OVGA", that is, a structure that is expressly designed to accept an essentially constant input amplitude while providing an output signal of widely varying amplitude.

Since the embodiments described above can be modified in arrangement and detail without departing from the inventive concepts, such changes and modifications are considered to fall within the scope of the following claims.

The invention claimed is:

1. An amplifier comprising:
   a series of interpolated input stages;
   an output stage coupled to the series of input stages; and
   an active feedback stage having an input coupled to an output of the output stage and an output coupled to an output of the input stages;
   wherein the active feedback stage comprises two or more active feedback cells that replicate one or more of the input stages.

2. An amplifier according to claim 1 where the input stages and active feedback cells comprise gm cells.

3. An amplifier according to claim 2 where the active feedback cells operate at fixed bias currents.

4. An amplifier according to claim 2 where the active feedback cells operate at variable bias currents.

5. An amplifier comprising:
   a series of interpolated input stages;
   an output stage coupled to the series of input stages; and
   an active feedback stage having an input coupled to an output of the output stage and an output coupled to an output of the input stages;
   wherein the active feedback stage comprises two or more active feedback cells; and
   wherein the active feedback cells operate at bias currents that replicate bias currents of the input stages.

6. An amplifier according to claim 1 where the inputs and outputs of two or more of the active feedback cells are coupled in parallel.

7. An amplifier according to claim 1 where the input stages have differential outputs, the output stage has differential inputs, and the active feedback stage has differential outputs.

8. An amplifier according to claim 1 further comprising an input attenuator coupled to the series of input stages.

9. A method comprising:
   interpolating a series of input stages;
   combining and coupling outputs of the input stages to a main amplifier;
   coupling the input and output of the main amplifier through an active feedback stage; and
   individually replicating more than one of the input stages in the active feedback stage.

10. A method according to claim 9 where individually replicating more than one of the input stages comprises operating more than one active feedback cell under conditions that approximate more than one of the input stages.

11. A method according to claim 10 where the input stages and active feedback cells comprise gm cells.

12. A method according to claim 11 where the active feedback cells operate at fixed bias currents.

13. A method according to claim 11 where the active feedback cells operate at variable bias currents.

14. A method according to claim 13 where the active feedback cells operate at bias currents that replicate bias currents of the input stages.

15. A method according to claim 10 further comprising combining outputs from more than one of the active feedback cells.

16. A method according to claim 10 where the input stages have differential outputs, the main amplifier has differential inputs, and the active feedback stage has differential outputs.

17. A method according to claim 10 further comprising:
    attenuating an input signal by different amounts to generate a series of attenuated signals; and
    coupling the series of attenuated signals to the series of input stages.

18. An amplifier comprising:
    means for selectively coupling a plurality of attenuated signals to a main amplifier; and
    means for providing active feedback to the amplifier by coupling a feedback signal to an input of the main amplifier;
    wherein the means for providing active feedback comprises two or more active feedback means that replicate one or more stages in the means for selectively coupling.

19. An amplifier according to claim 18 where the active feedback means comprise gm cells.

20. An amplifier according to claim 18 further comprising attenuation means for generating the plurality of attenuated signals.

21. An amplifier according to claim 8 further comprising a feedback attenuator that matches all or part of the input attenuator.

* * * * *